(12) United States Patent
Wakayama et al.

(10) Patent No.: US 7,342,434 B2
(45) Date of Patent: Mar. 11, 2008

(54) SEMICONDUCTOR DEVICE INCLUDING CAPACITOR HAVING DECOUPLING CAPACITY

(75) Inventors: Shigetoshi Wakayama, Kawasaki (JP); Mutsuaki Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 11/042,090

(22) Filed: Jan. 26, 2005

(65) Prior Publication Data

US 2006/0061409 A1   Mar. 23, 2006

(30) Foreign Application Priority Data

Sep. 17, 2004   (JP) .............................. 2004-272382

(51) Int. Cl.
*G11C 5/14* (2006.01)
(52) U.S. Cl. ...................................... 327/530; 327/541
(58) Field of Classification Search ................ 327/530, 327/537–538, 540–541, 543
See application file for complete search history.

(56) References Cited

U.S. PATENT DOCUMENTS

| | | | | |
|---|---|---|---|---|
| 5,812,021 A | * | 9/1998 | Ikeda ......................... | 327/541 |
| 6,084,464 A | | 7/2000 | Lin ............................ | 327/525 |
| 6,147,541 A | * | 11/2000 | Seesink ....................... | 327/337 |
| 6,388,511 B1 | * | 5/2002 | Kanao ........................ | 327/558 |
| 6,441,676 B1 | * | 8/2002 | Koehl et al. ................. | 327/525 |
| 6,759,880 B2 | * | 7/2004 | Koch et al. .................. | 327/112 |
| 6,867,633 B2 | * | 3/2005 | Godat ........................ | 327/306 |

FOREIGN PATENT DOCUMENTS

| | | |
|---|---|---|
| JP | 2003-017569 | 1/2003 |
| JP | 2003-513478 | 4/2003 |

\* cited by examiner

*Primary Examiner*—Cassandra Cox
(74) *Attorney, Agent, or Firm*—Arent Fox LLP

(57) ABSTRACT

A capacitor has a MOS gate structure in which a gate insulating film is held between a gate terminal and a ground terminal as a dielectric. A switch unit is connected between the gate terminal and a power supply. The ground terminal is connected to a ground. A switch control circuit that switches a state of the switch unit between a conductive state and a nonconductive state is provided. A predetermined voltage and a voltage of the gate terminal are input to a non-inverting input terminal and an inverting input terminal of the switch control circuit, respectively. The switch unit is conductive when the voltage of the gate terminal is higher than the predetermined voltage, and nonconductive when the voltage of the gate terminal is lower than the predetermined voltage.

12 Claims, 10 Drawing Sheets

SEMICONDUCTOR DEVICE INCLUDING CAPACITOR HAVING DECOUPLING CAPACITY

CROSS-REFERENCE TO RELATED APPLICATIONS

This application is based upon and claims the benefit of priority from the prior Japanese Patent Application No. 2004-272382, filed on Sep. 17, 2004, the entire contents of which are incorporated herein by reference.

BACKGROUND OF THE INVENTION

1) Field of the Invention

The present invention relates to a semiconductor device having a decoupling capacity. More specifically, the present invention relates to a circuit to disconnect a capacitor, which functions as the decoupling capacity, from a power supply when a dielectric breakdown occurs in the capacitor.

2) Description of the Related Art

In recent years, demand for acceleration and high integration of semiconductor chips rises following improved performances of such as home electric appliances. To meet this demand, a gate area of each metal oxide semiconductor (MOS) transistor integrated in a semiconductor chip is increased. A semiconductor chip required to operate at a high rate, in particular, is intended to stabilize a power supply voltage by connecting many decoupling capacities between a power supply and a ground.

Normally, a capacitor that functions as a decoupling capacity (hereinafter, simply "capacitor") has a MOS gate structure. In addition, the capacity uses, as a dielectric, an insulating film formed simultaneously with a gate insulating film of the MOS transistor. Therefore, if the gate insulating film of the MOS transistor is thinner following a recent advancement of a microfabrication technique, the dielectric of the capacitor is thinner accordingly. As a result, a time-dependent dielectric breakdown (TDDB) frequently occurs. Namely, a defect of a dielectric breakdown of a capacitor frequently occurs while a customer uses a semiconductor chip shipped from a manufacturer. If the TDDB occurs to the capacitor, then a short-circuit between a power supply and a ground occurs. This disadvantageously causes an increase in current consumption and a drop in the power supply voltage. It is, therefore, necessary to take measures not to cause such defects when the TDDB occurs to the capacitor after shipment.

Meanwhile, when occurrence of the TDDB to the capacitor is discovered at a semiconductor chip test conducted just before the shipment, the semiconductor chip is abandoned as a defective product even if a defective capacitor is only a part of the capacitors on the semiconductor chip. This disadvantageously deteriorates product yield. To prevent this, a semiconductor integrated circuit has been suggested in which a p channel MOS transistor (hereinafter, "PMOS") is connected between the power supply and the capacitor, which is disconnected from the power supply when it is determined to be defective by turning off the PMOS through a signal from an external control circuit (see for example, Japanese Patent Application Laid-open No. 2003-17569 (FIGS. 1 and 2)). The product yield is improved since this semiconductor integrated circuit can be shipped as a good product by disconnecting the defective capacitor from the power supply.

According to Japanese Patent Application Laid-open No. 2003-17569, however, the capacitor that becomes defective after the shipment (in other words, while a client uses the product) cannot be disconnected from the power supply. Thus, this conventional semiconductor integrated circuit is disadvantageously incapable of dealing with the capacitor to which a defect occurs after the shipment.

SUMMARY OF THE INVENTION

It is an object of the present invention to at least solve the problems in the conventional technology.

A semiconductor device according to an aspect of the present invention includes a capacitor with a gate terminal, a ground terminal, and a gate insulating film between the gate terminal and the ground terminal; a switch unit that electrically connects or disconnects the gate terminal to a power supply; and a switch control unit that switches on the switch unit when a voltage of the gate terminal is higher than a predetermined voltage, and switches off the switch unit when the voltage of the gate terminal is lower than the predetermined voltage.

A semiconductor device according to another aspect of the present invention includes a capacitor unit that has a plurality of parallel-connected capacitors with a gate terminal, a ground terminal, and a gate insulating film between the gate terminal and the ground terminal; a switch unit that electrically connects or disconnects the gate terminals to a power supply; and a switch control unit that switches on the switch unit when a voltage of the capacitor unit is higher than a predetermined voltage, and switches off the switch unit when the voltage of the capacitor unit is lower than the predetermined voltage.

A semiconductor device according to still another aspect of the present invention includes a capacitor with a gate terminal, a ground terminal, and a gate insulating film between the gate terminal and the ground terminal; a switch unit that electrically connects or disconnects the ground terminal to a ground; and a switch control unit that switches on the switch unit when a voltage of the ground terminal is lower than a predetermined voltage, and switches off the switch unit when the voltage of the ground terminal is higher than the predetermined voltage.

A semiconductor device according to still another aspect of the present invention includes a capacitor unit that has a plurality of parallel-connected capacitors with a gate terminal, a ground terminal, and a gate insulating film between the gate terminal and the ground terminal; a switch unit that electrically connects or disconnects the ground terminals to a ground; and a switch control unit that switches on the switch unit when a voltage of the capacitor unit is lower than a predetermined voltage, and switches off the switch unit when the voltage of the capacitor unit is higher than the predetermined voltage.

The other objects, features, and advantages of the present invention are specifically set forth in or will become apparent from the following detailed description of the invention when read in conjunction with the accompanying drawings.

DETAILED DESCRIPTION

Exemplary embodiments and principles of a semiconductor device according to the present invention will be explained below in detail with reference to the accompanying drawings. In the explanations and the drawings, identical elements are designated by identical reference signs.

Figure 1:
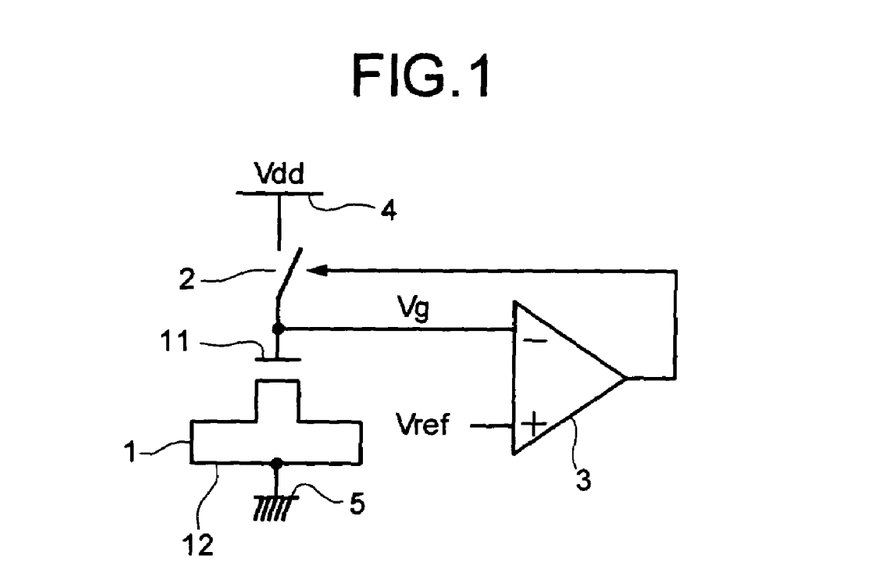
FIG. 1 is a circuit diagram for explaining a principle of a first configuration of a semiconductor device according to the present invention.

FIG. 1 is a circuit diagram for explaining a principle of a first configuration of a semiconductor device according to the present invention. As shown in FIG. 1, a capacitor 1 has a MOS gate structure in which a dielectric (hereinafter, "gate insulating film") is put between a gate terminal 11 and a ground terminal 12. A switch unit 2 is connected between the gate terminal 11 and a power supply 4. The ground terminal 12 is connected to a ground 5.

The semiconductor also includes a switch control circuit 3 that switches a state of the switch unit 2 between a conductive state (an ON state) and a nonconductive state (an OFF state). A predetermined voltage (hereinafter, "reference voltage") Vref and a voltage of the gate terminal 11 (hereinafter, "gate voltage") Vg are input to a non-inverting input terminal (a positive terminal) and an inverting input terminal (a negative terminal) of the switch control circuit 3, respectively. The gate voltage Vg when a dielectric breakdown occurs to the capacitor 1 is a divided voltage obtained by dividing a difference between a power supply voltage Vdd and a ground voltage Vss by a resistance of the switch unit 2 and a resistance of the capacitor 1 (a MOS diode) to which the dielectric breakdown occurs. The reference voltage Vref is, therefore, set at a voltage between the power supply voltage Vdd and this divided voltage.

According to this first configuration, in a normal state, the switch unit 2 is conductive and the gate voltage Vg is close to the power supply voltage Vdd. Therefore, the gate voltage Vg is higher than the reference voltage Vref, and an output voltage of the switch control circuit 3 is at a relatively low level (hereinafter, "L level"). In this state, when a short-circuit occurs between the gate terminal 11 and the ground terminal 12 of the capacitor 1, the gate voltage Vg, which is pulled toward the ground voltage Vss, reduces. The output voltage of the switch control circuit 3 is switched to a relatively high level (hereinafter, "H level") when the gate voltage Vg becomes lower than the reference voltage Vref.

Accordingly, if the switch unit 2 is constituted by such a switch that is turned on when the output voltage of the switch control circuit 3 is at the L level and turned off when the output voltage of the switch control circuit 3 is at the H level, the gate terminal 11 is always connected to the power supply 4 in a normal state, that is, the capacitor 1 functions as a decoupling capacity. After the short-circuit occurs in the capacitor 1, the gate terminal 11 is disconnected from the power supply 4, thereby making it possible to prevent a short-circuit between the power supply 4 and the ground 5.

Figure 2:
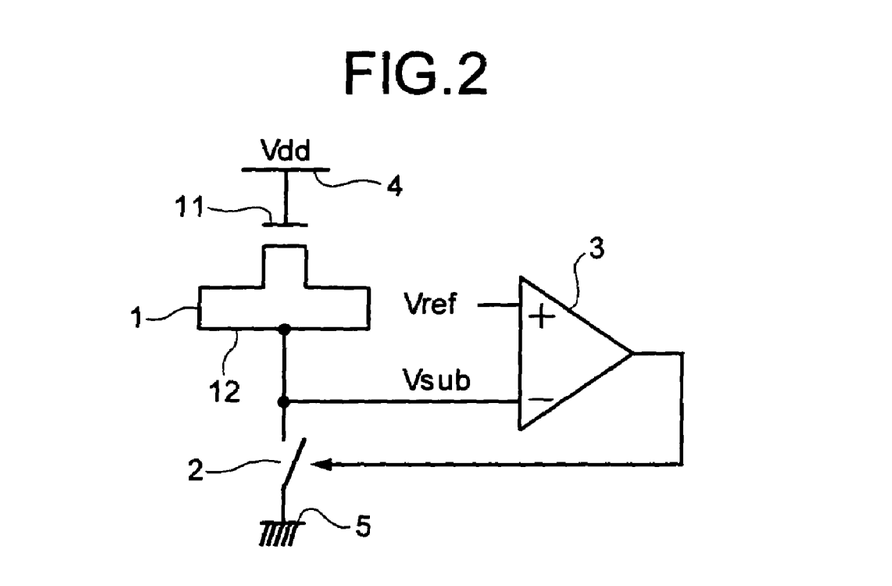
FIG. 2 is a circuit diagram for explaining a principle of a second configuration of the semiconductor device according to the present invention.

FIG. 2 is a circuit diagram for explaining a principle of a second configuration of the semiconductor device according to the present invention. As shown in FIG. 2, the gate terminal 11 of the capacitor 1 is connected to the power supply 4. The switch unit 2 is connected between the ground terminal 12 of the capacitor 1 and the ground 5. A voltage of the ground terminal 12 (hereinafter, "substrate voltage") Vsub is input to the inverting input terminal (negative terminal) of the switch control circuit 3. The substrate voltage Vsub when the dielectric breakdown occurs to the capacitor 1 is a divided voltage obtained by dividing the difference between the power supply voltage Vdd and the ground voltage Vss by the resistance of the capacitor 1 (the MOS diode) to which the dielectric breakdown occurs and the resistance of the switch unit 2. The reference voltage Vref is, therefore, set at a voltage between this divided voltage and the ground voltage Vss. Since the other constituent elements of the second configuration are equal to those of the first configuration shown in FIG. 1, they are denoted by the same reference signs as those shown in FIG. 1, respectively, and will not be explained herein.

According to this second configuration, in a normal state, the switch unit 2 is conductive and the substrate voltage Vsub is close to the ground voltage Vss. Therefore, the substrate voltage Vsub is lower than the reference voltage Vref, and the output voltage of the switch control circuit 3 is at the H level. In this state, when a short-circuit occurs between the gate terminal 11 and the ground terminal 12 of the capacitor 1, the substrate voltage Vsub, which is pulled toward the power supply voltage Vdd, increases. When the substrate voltage Vsub becomes higher than the reference voltage Vref, the output voltage of the switch control circuit 3 is switched to the L level.

Accordingly, if the switch unit 2 is constituted by such a switch that is turned on when the output voltage of the switch control circuit 3 is at the H level and turned off when the output voltage of the switch control circuit 3 is at the L level, the ground terminal 12 is always connected to the ground 5 in a normal state, that is, the capacitor 1 functions as a decoupling capacity. After the short-circuit occurs in the capacitor 1, the ground terminal 12 is disconnected from the ground 5, thereby making it possible to prevent a short-circuit between the power supply 4 and the ground 5.

Figure 3:
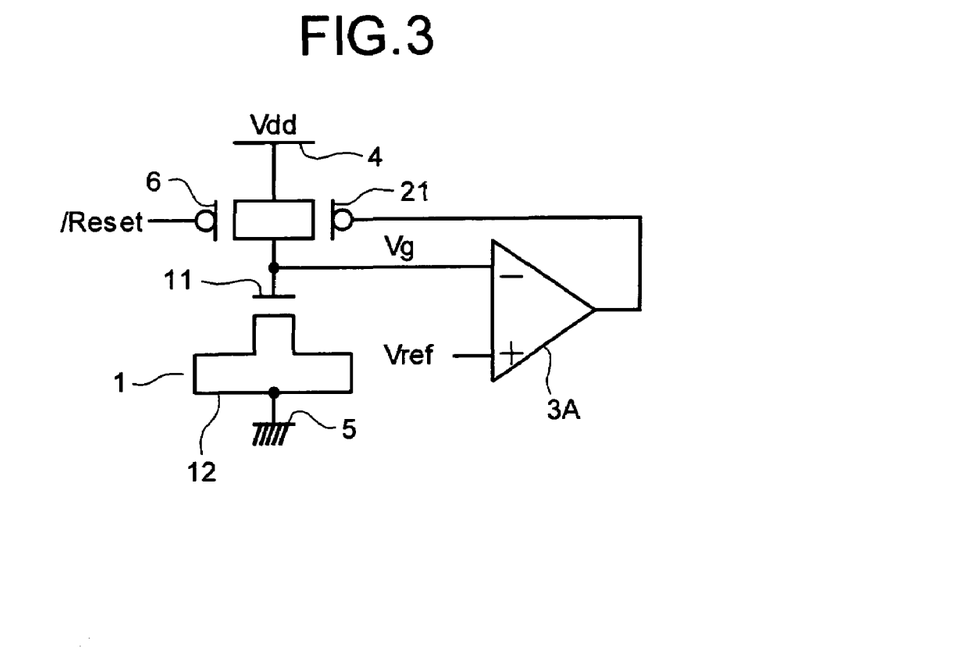
FIG. 3 is a circuit diagram that depicts one example of a semiconductor device according to a first embodiment of the present invention.

FIG. 3 is a circuit diagram that depicts one example of a semiconductor device according to a first embodiment of the present invention. As shown in FIG. 3, the semiconductor device in the first embodiment has the first configuration shown in FIG. 1 and includes a PMOS 21 used as the switch unit 2. Further, a PMOS 6 is provided between the gate terminal 11 and the power supply 4, and connected to the PMOS 21 in parallel as a reset unit that initializes the voltage of the gate terminal 11. The PMOS 21 serving as the switch unit 2 will be referred to as "first PMOS 21" and the PMOS 6 serving as the reset unit will be referred to as "second PMOS 6", hereinafter.

A source, a gate, and a drain of the first PMOS 21 are connected to the power supply 4, an output terminal of a switch control circuit 3A, and the gate terminal 11 of the capacitor 1, respectively. A source and a drain of the second PMOS 6 are connected to the power supply 4 and the gate terminal 11, respectively. A reset signal (/Reset) is input to a gate of the second PMOS 6 from a control circuit (not shown). The other constituent elements of the semiconductor device are equal to those of the first configuration shown in FIG. 1.

Figure 4:
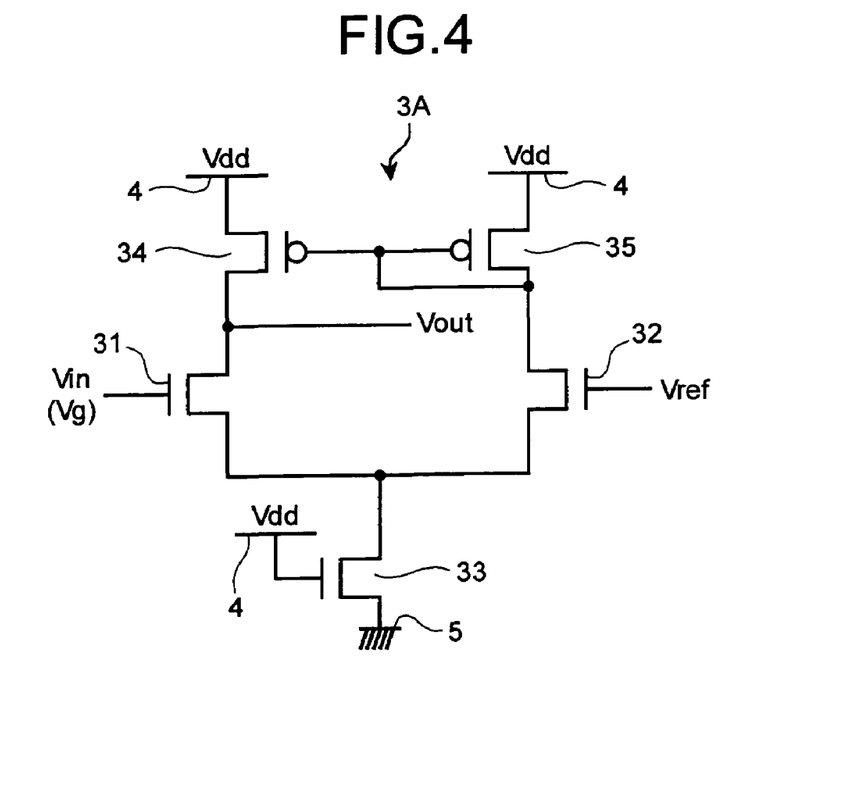
FIG. 4 is a circuit diagram that depicts one example of a switch control circuit.

FIG. 4 is a circuit diagram that depicts one example of the switch control circuit 3A. The switch control circuit 3A is a typical differential amplifier that includes three n channel MOS transistors (hereinafter, "NMOSs") 31, 32, and 33 and two PMOSs 34 and 35. A gate input voltage Vin of the NMOS 31 is the gate voltage Vg of the capacitor 1. The reference voltage Vref is input to a gate of the NMOS 32. A source of the NMOS 31 and a source of the NMOS 32 are connected to a drain of the NMOS 33 serving as a current source. A gate and a source of the NMOS 33 are connected to the power supply 4 and the ground 5, respectively.

A drain of the NMOS 31 and a drain of the NMOS 32 are connected to a drain of the PMOS 34 and a drain of the PMOS 35, respectively. A source of the PMOS 34 and a source of the PMOS 35 are connected to the power supply 4. A gate of the PMOS 34 is connected to a gate of the PMOS 35, the drain of the PMOS 35, and the drain of the NMOS 32. The drain of the PMOS 34 and the drain of the NMOS 31 are connected to an output terminal of this differential amplifier, and an output voltage Vout is output from the output terminal. A differential amplifier having a different configuration to that shown in FIG. 4 can be used as the switch control circuit 3A.

An operation of the semiconductor device constituted as shown in FIG. 3 will next be explained. After a current is carried to the semiconductor device, the second PMOS 6 becomes conductive in response to the reset signal that is at the L level. The gate voltage Vg input to the switch control circuit 3A is thereby equal to the power supply voltage Vdd, in other words, higher than the reference voltage Vref. Accordingly, the output voltage of the switch control circuit 3A becomes at the L level and the first PMOS 21 becomes conductive. Thereafter, the reset signal turns to be the H level and the second PMOS 6 is made nonconductive. However, since the first PMOS 21 is conductive, the state in which the output voltage of the switch control circuit 3A is at the L level and the first PMOS 21 is conductive is kept.

In a normal state, that is, if no dielectric breakdown occurs to the gate insulating film of the capacitor 1, the gate voltage Vg is always equal to the power supply voltage Vdd. Therefore, the first PMOS 21 is conductive and the capacitor 1 functions as a decoupling capacity. In this state, when a dielectric breakdown occurs to the gate insulating film of the capacitor 1, the gate voltage Vg is reduced. When the gate voltage Vg becomes lower than the reference voltage Vref, then the output voltage of the switch control circuit 3A is switched to the H level, and the first PMOS 21 is made nonconductive. Namely, the gate terminal 11 is disconnected from the power supply 4, so that a short-circuit between the power supply 4 and the ground 5 through the capacitor 1 to which the dielectric breakdown occurs can be prevented.

Figure 5:
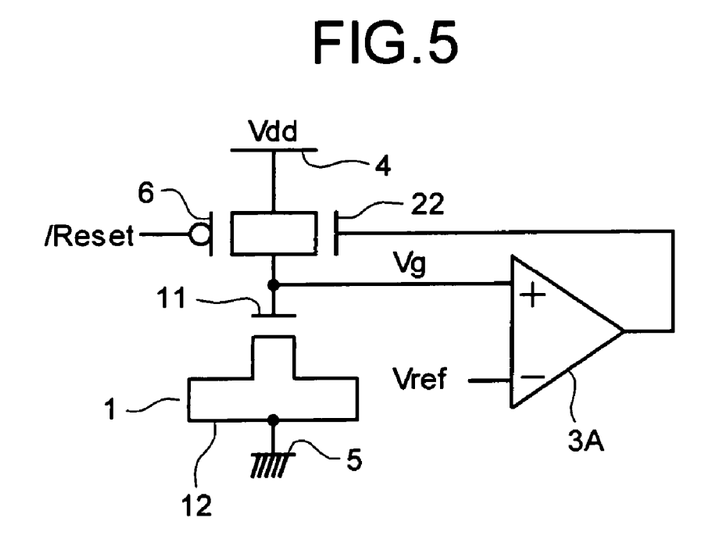
FIG. 5 is a circuit diagram that depicts another example of the semiconductor device according to the first embodiment.
Figure 6:
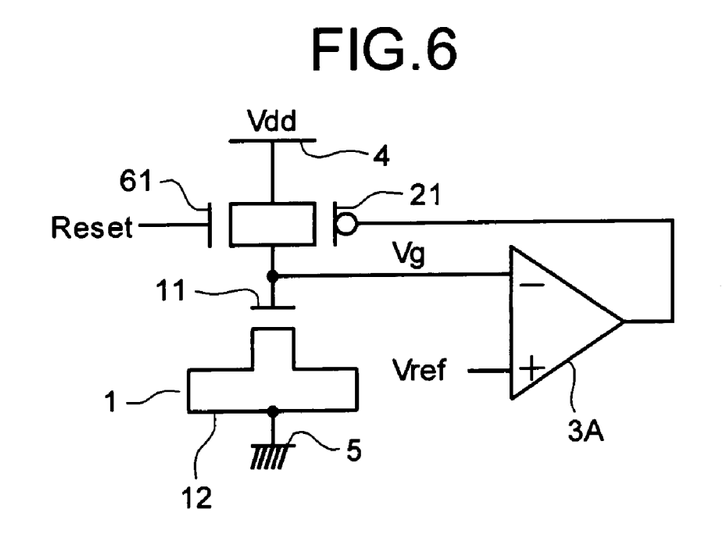
FIG. 6 is a circuit diagram that depicts still another example of the semiconductor device according to the first embodiment.

As shown in FIG. 5, the switch unit 2 can be an NMOS 22 in place of the first PMOS 21. In this case, the gate voltage Vg and the reference voltage Vref are input to the non-inverting input terminal (positive terminal) and the inverting input terminal (negative terminal) of the switch control circuit 3A, respectively. As shown in FIG. 6, the reset unit can be an NMOS 61 in place of the second PMOS 6. In this case, the reset signal (Reset) input to a gate of the NMOS 61 turns to be the H level right after the current is carried to the semiconductor device, and then changes to the L level. The semiconductor devices in the examples shown in FIGS. 5 and 6 can exhibit the same advantages as those of the semiconductor device in the example shown in FIG. 3.

Figure 7:
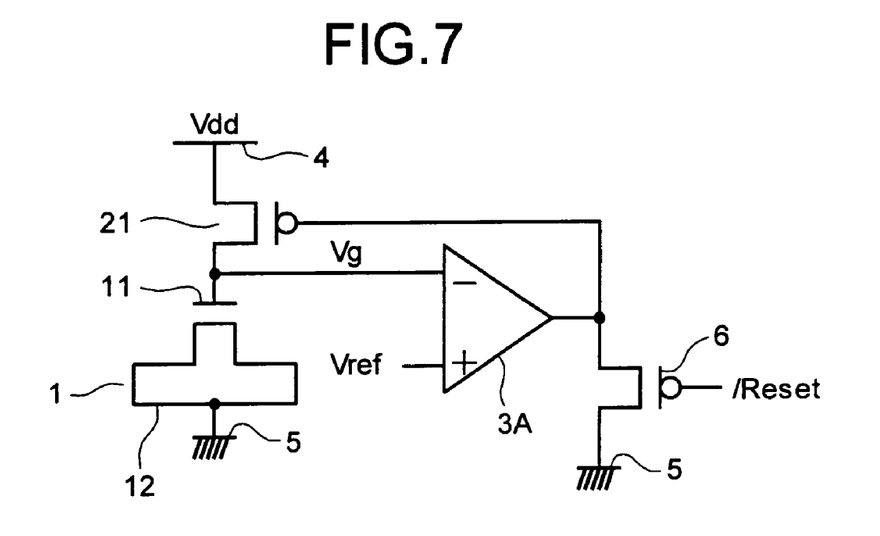
FIG. 7 is a circuit diagram that depicts one example of a semiconductor device according to a second embodiment of the present invention.

FIG. 7 is a circuit diagram that depicts one example of a semiconductor device according to a second embodiment of the present invention. The semiconductor device according to the second embodiment differs from that according to the first embodiment in that the second PMOS 6 serving as the reset unit is connected between the gate of the first PMOS 21 and the ground 5. The other constitution of the semiconductor device according to the second embodiment is equal to that according to the first embodiment. With this configuration, when the reset signal (/Reset) turns to be the L level right after the current is carried to the semiconductor device, the second PMOS 6, and then the first PMOS 21 become conductive.

Figure 8:
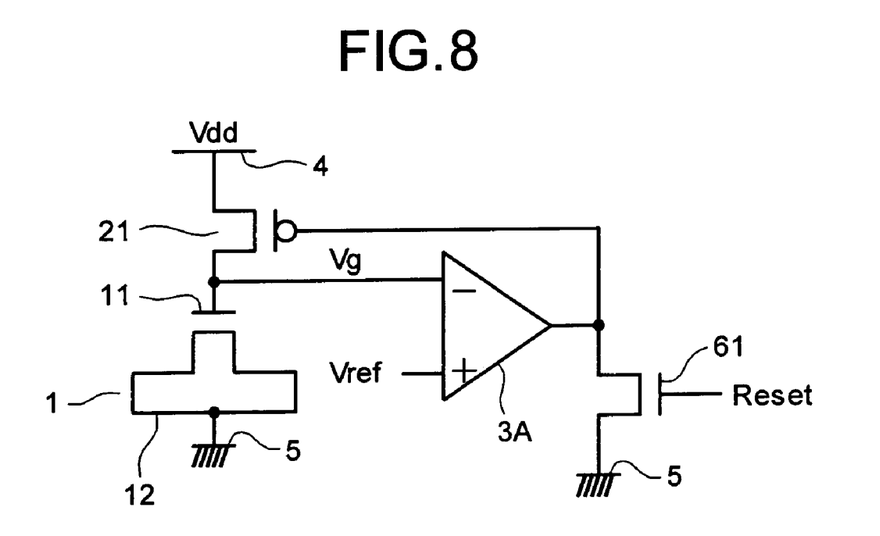
FIG. 8 is a circuit diagram that depicts another example of the semiconductor device according to the second embodiment.

The semiconductor device shown in FIG. 8 differs from that shown in FIG. 7 in that the reset unit is the NMOS 61 in place of the second PMOS 6. With this configuration, when the reset signal (Reset) turns to be the H level right after the current is carried to the semiconductor, the NMOS 61, and then the first PMOS 21 become conductive. The semiconductor devices in the examples shown in FIGS. 7 and 8 according to the second embodiment exhibit the same advantages as those of the semiconductor device according to the first embodiment.

Figure 9:
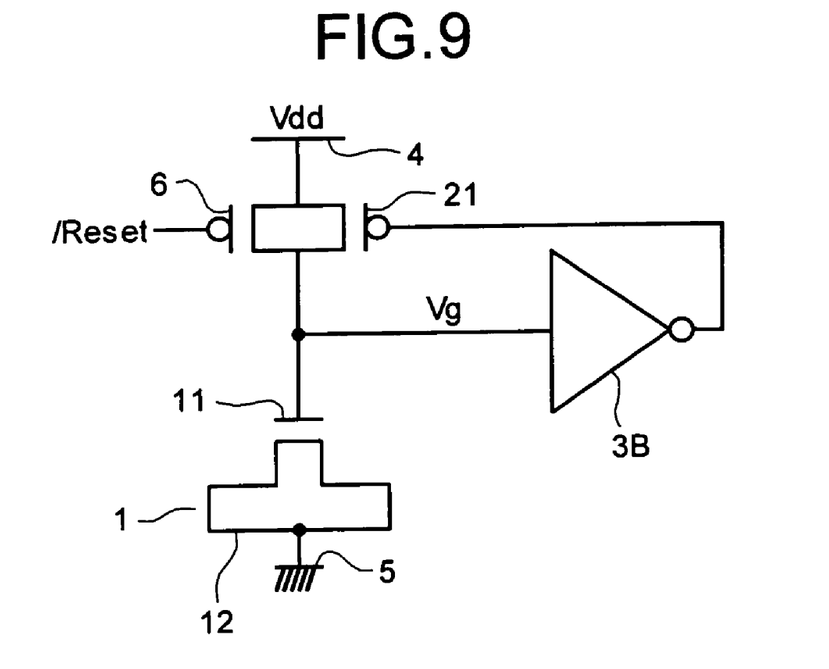
FIG. 9 is a circuit diagram that depicts one example of a semiconductor device according to a third embodiment of the present invention.
Figure 10:
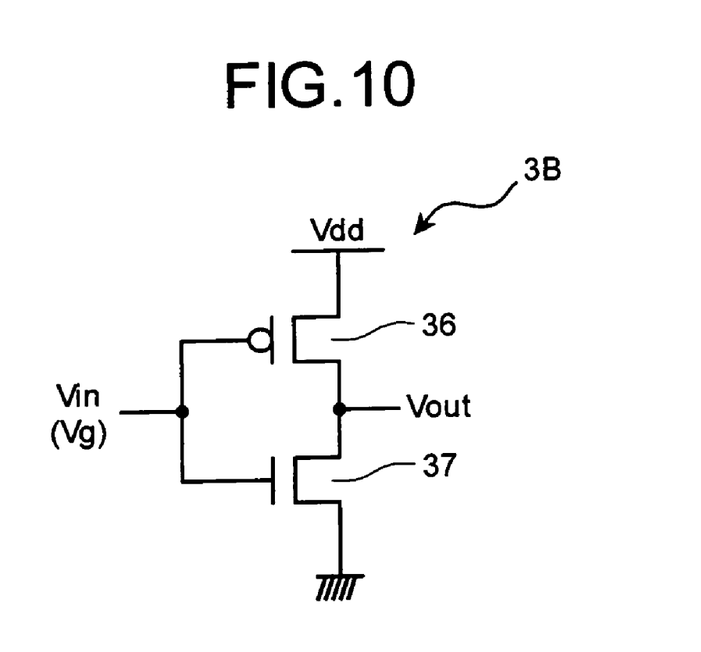
FIG. 10 is a circuit diagram that depicts another example of the switch control circuit.

FIG. 9 is a circuit diagram that depicts one example of a semiconductor device according to a third embodiment of the present invention. As shown in FIG. 9, the semiconductor device according to the third embodiment differs from that according to the first embodiment in that an inverter circuit is used as a switch control circuit 3B. FIG. 10 is a circuit diagram of the inverter circuit. As shown in FIG. 10, a gate input voltage Vin of a PMOS 36 and an NMOS 37 is the gate voltage Vg of the capacitor 1. A drain of the PMOS 36 and a drain of the NMOS 37 are connected to an output terminal of this inverter circuit, and the output voltage Vout is output from the output terminal.

A threshold, that is, the reference voltage Vref of this inverter circuit is about half the power supply voltage Vdd. However, by adjusting a gate length and a gate width of each of the PMOS 36 and the NMOS 37, the reference voltage Vref can be changed. The semiconductor device according to the third embodiment can exhibit the same advantages as those of the semiconductor device according to the first embodiment. Further, according to the third embodiment, a circuit scale can be reduced, as compared with the semiconductor device in which the differential amplifier is used as the switch control circuit 3.

Figure 11:
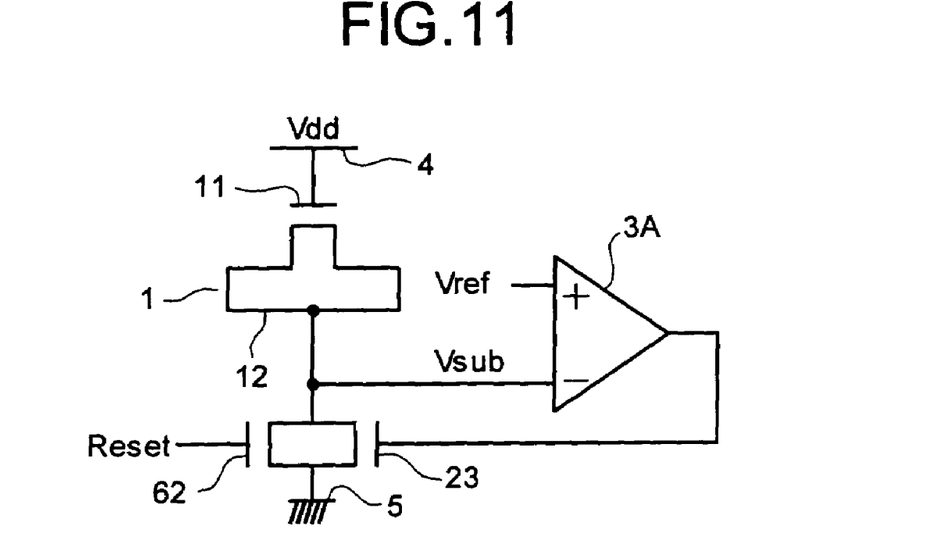
FIG. 11 is a circuit diagram that depicts one example of a semiconductor device according to a fourth embodiment of the present invention.

FIG. 11 is a circuit diagram that depicts one example of a semiconductor device according to a fourth embodiment of the present invention. As shown in FIG. 11, the semiconductor device according to the fourth embodiment has the second configuration shown in FIG. 2, and an NMOS 23 is used as the switch unit 2. In addition, an NMOS 62 serving as the reset unit that initializes the voltage of the ground terminal 12 is provided between the ground terminal 12 and the ground 5 and connected in parallel to the NMOS 23. The NMOS 23 serving as the switch unit 2 will be referred to as "first NMOS 23" and the NMOS 62 serving as the reset unit will be referred to as "second NMOS 62", hereinafter. A source, a gate, and a drain of the first NMOS 23 are connected to the ground 5, the output terminal of the switch control circuit 3A, and the ground terminal 12 of the capacitor 1, respectively.

A source and a drain of the second NMOS 62 are connected to the ground 5 and the ground terminal 12, respectively. The reset signal (Reset) is input to a gate of the second NMOS 62 from a control circuit (not shown). The switch control circuit 3A is a typical differential amplifier shown in FIG. 4. Other constituent elements of the semiconductor device are equal to those of the second configuration shown in FIG. 2. A differential amplifier having a different configuration to that shown in FIG. 4 can be used as the switch control circuit 3A.

An operation of the semiconductor device constituted as shown in FIG. 11 will next be explained. After a current is carried to the semiconductor device, the second NMOS 62 becomes conductive in response to the reset signal that is at the H level. The substrate voltage Vsub input to the switch control circuit 3A is thereby equal to the ground voltage Vss, in other words, lower than the reference voltage Vref. Accordingly, the output voltage of the switch control circuit 3A becomes at the H level and the first NMOS 23 becomes conductive. Thereafter, the reset signal turns to be the L level and the second NMOS 62 is made nonconductive. However, since the first NMOS 23 is conductive, the state in which the output voltage of the switch control circuit 3A is at the H level and the first NMOS 23 is conductive is kept.

In a normal state, that is, if no dielectric breakdown occurs to a gate insulating film of the capacitor 1, the substrate voltage Vsub is always equal to the ground voltage Vss. Therefore, the first NMOS 23 is conductive and the capacitor 1 functions as the decoupling capacity. In this state, if a dielectric breakdown occurs to the gate insulating film of the capacitor 1, the substrate voltage Vsub is increased. When the substrate voltage Vsub becomes higher than the reference voltage Vref, then the output voltage of the switch control circuit 3A is switched to the L level and the first NMOS 23 is made nonconductive. Namely, the ground terminal 12 is disconnected from the ground 5, so that a short-circuit between the power supply 4 and the ground 5 through the capacitor 1 to which the dielectric breakdown occurs can be prevented.

Figure 12:
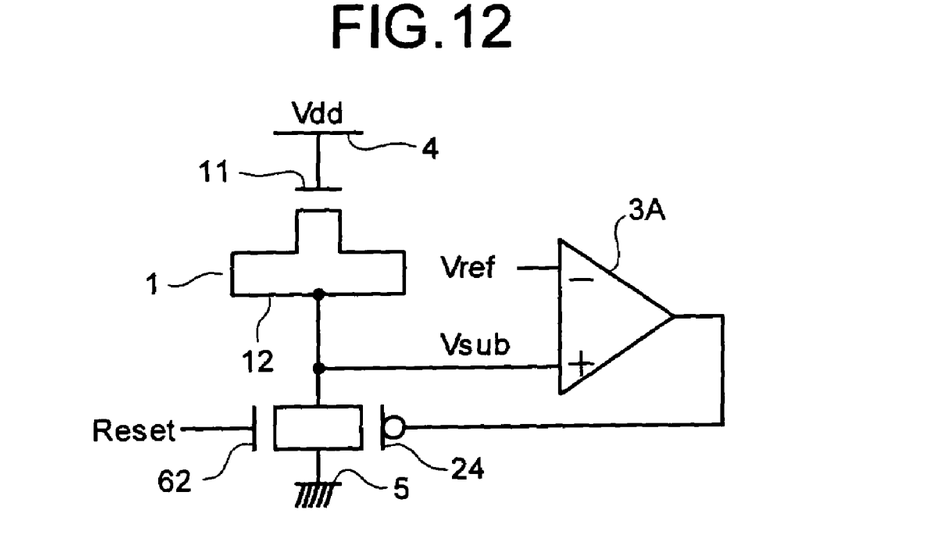
FIG. 12 is a circuit diagram that depicts another example of the semiconductor device according to the fourth embodiment.
Figure 13:
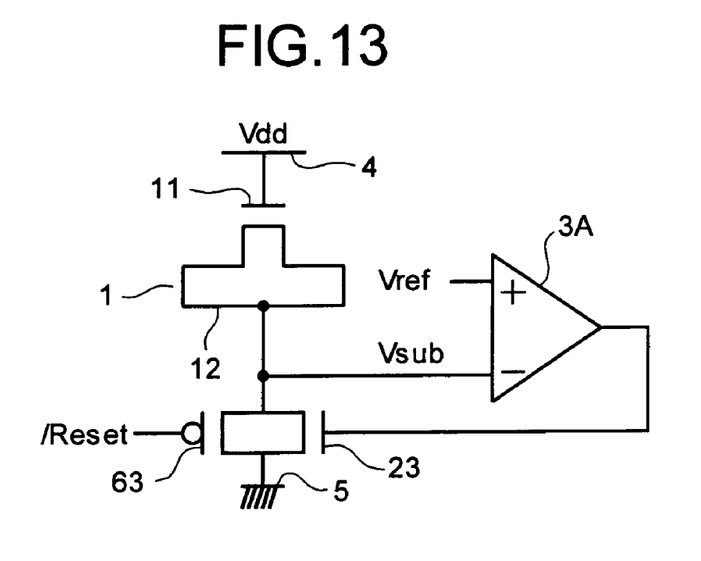
FIG. 13 is a circuit diagram that depicts still another example of the semiconductor device according to the fourth embodiment.

As shown in FIG. 12, the switch unit 2 can be a PMOS 24 in place of the first NMOS 23. In this case, the substrate voltage Vsub and the reference voltage Vref are input to the non-inverting input terminal (positive terminal) and the inverting input terminal (negative terminal) of the switch control circuit 3A, respectively. As shown in FIG. 13, the reset unit can be a PMOS 63 in place of the second NMOS 62. In this case, the reset signal (/Reset) input to a gate of the PMOS 63 turns to be the L level right after the current is carried to the semiconductor device, and then changes to the H level. The semiconductor devices in the examples shown in FIGS. 12 and 13 can exhibit the same advantages as those of the semiconductor device in the example shown in FIG. 11.

Figure 14:
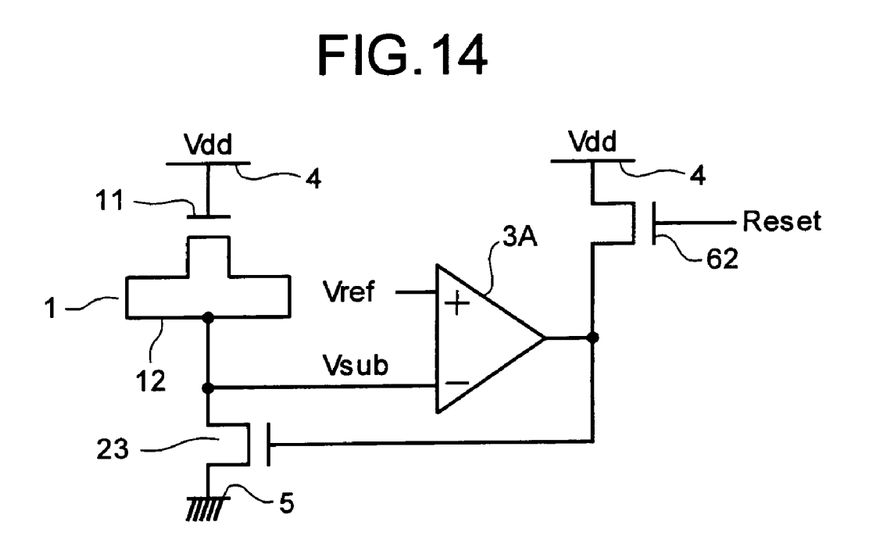
FIG. 14 is a circuit diagram that depicts one example of a semiconductor device according to a fifth embodiment of the present invention.

FIG. 14 is a circuit diagram that depicts one example of a semiconductor device according to a fifth embodiment of the present invention. As shown in FIG. 14, the semiconductor device according to the fifth embodiment differs from that according to the fourth embodiment in that the second NMOS 62 serving as the reset unit is connected between the gate of the first NMOS 23 and the power supply 4. Other constitution of the semiconductor device is equal to that of the semiconductor device according to the fourth embodiment. With such a configuration, when the reset signal (Reset) turns to be the H level right after the current is carried to the semiconductor device, the second NMOS 62, and then the first NMOS 23 become conductive.

Figure 15:
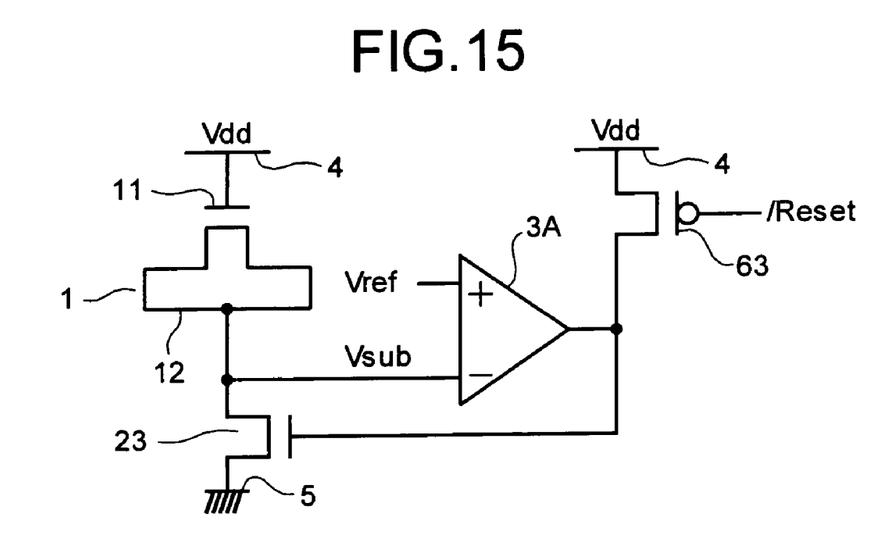
FIG. 15 is a circuit diagram that depicts another example of the semiconductor device according to the fifth embodiment.

A semiconductor device shown in FIG. 15 differs from that shown in FIG. 14 in that the reset unit is the PMOS 63 in place of the second NMOS 62. With this configuration, when the reset signal (/Reset) turns to be the L level right after the current is carried to the semiconductor device, the PMOS 63, and then the first NMOS 23 become conductive. The semiconductor devices in the examples shown in FIGS. 14 and 15 can exhibit the same advantages as those of the semiconductor device according to the fourth embodiment.

Figure 16:
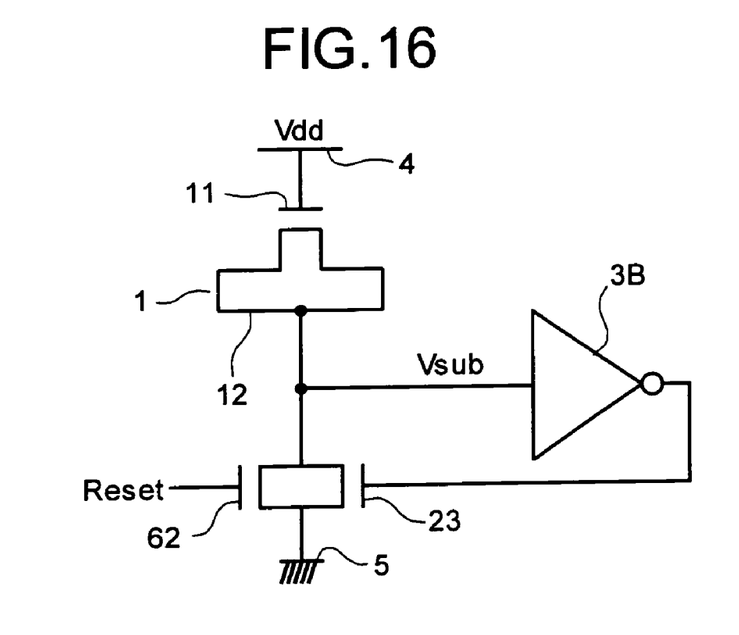
FIG. 16 is a circuit diagram that depicts one example of a semiconductor device according to a sixth embodiment of the present invention.

FIG. 16 is a circuit diagram that depicts one example of a semiconductor device according to a sixth embodiment of the present invention. As shown in FIG. 16, the semiconductor device according to the sixth embodiment differs from that according to the fourth embodiment in that the inverter circuit shown in FIG. 10 is used as the switch control circuit 3B. The semiconductor device according to the sixth embodiment can exhibit the same advantages as those of the semiconductor device according to the fourth embodiment. Further, according to the sixth embodiment, a circuit scale can be reduced, as compared with the semiconductor device in which the differential amplifier is used as the switch control circuit 3.

Figure 17:
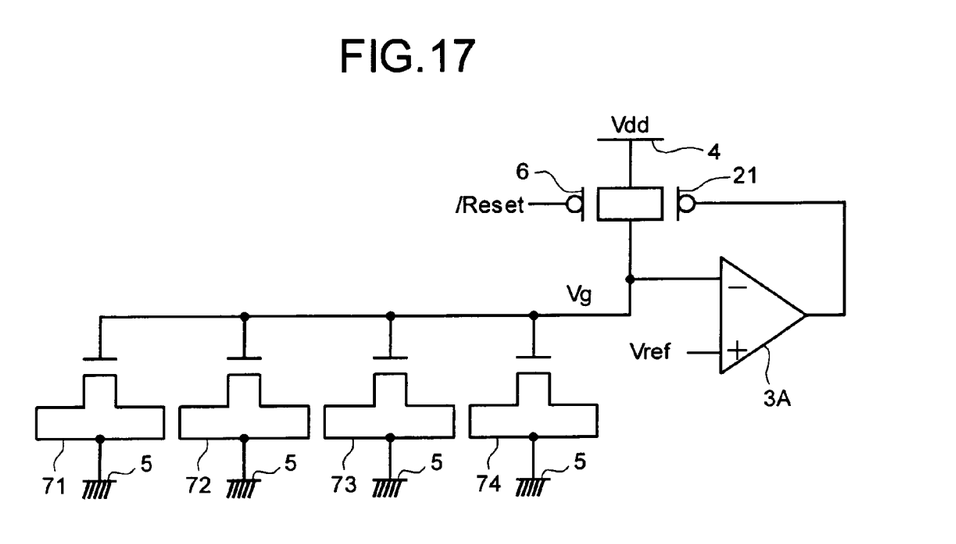
FIG. 17 is a circuit diagram that depicts one example of a semiconductor device according to a seventh embodiment of the present invention.

FIG. 17 is a circuit diagram that depicts one example of a semiconductor device according to a seventh embodiment of the present invention. As shown in FIG. 17, the semiconductor device according to the seventh embodiment is based on the configuration according to the first embodiment. However, the first PMOS 21, the second PMOS 6 and the switch control circuit 3A are shared among a plurality of, for example, four capacitors 71, 72, 73, and 74. With this configuration, if a dielectric breakdown occurs to a gate insulating film of at least one of the capacitors 71, 72, 73, and 74 connected to the first PMOS 21, the first PMOS 21 becomes nonconductive.

Figure 18:
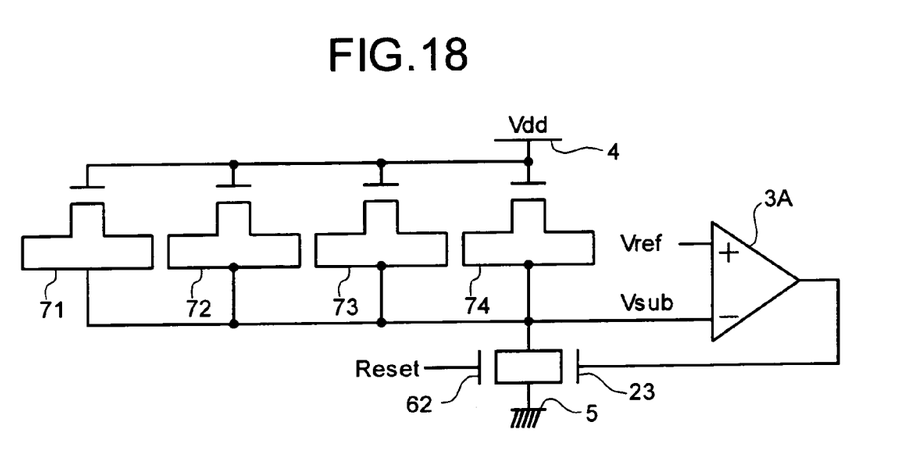
FIG. 18 is a circuit diagram that depicts another example of the semiconductor device according to the seventh embodiment.

According to this configuration, the semiconductor device can exhibit the same advantages as those of the semiconductor device according to the first embodiment. In addition, an area occupied by the switch unit 2, the reset unit, and the switch control circuit 3A can be reduced, as compared with the semiconductor device in which the switch unit 2, the reset unit, and the switch control circuit 3A are provided for each capacitor. The seventh embodiment is applicable to the configurations according to the second to the sixth embodiments. For example, FIG. 18 is a circuit diagram that depicts one example in which the seventh embodiment is applied to the configurations according to the forth embodiment.

The semiconductor devices according to the present invention have the following advantage. The state of the switch unit is switched between the conductive state and the nonconductive state based on the voltage of the gate terminal or the ground terminal of the capacitor. Therefore, even if a dielectric breakdown occurs to the capacitor while the customer uses the product, the defective capacitor can be automatically disconnected from the power supply or the ground by switching the state of the switch unit to the nonconductive state based on a change in the voltage of the gate terminal or the ground terminal of the capacitor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a capacitor that includes
      a gate terminal;
      a ground terminal; and
      a gate insulating film between the gate terminal and the ground terminal;
   a switch unit that electrically connects or disconnects the gate terminal to a power supply;
   a switch control unit that switches on the switch unit when a voltage of the gate terminal is higher than a predetermined voltage, and switches off the switch unit when the voltage of the gate terminal is lower than the predetermined voltage, and
   a reset unit that switches on the switch unit right after the power supply is turned on.

2. The semiconductor device according to claim 1, wherein the switch unit includes a p channel metal oxide semiconductor field effect transistor.

3. The semiconductor device according to claim 1, further comprising:
   a reset unit that resets the voltage of the gate terminal to electrically connect the gate terminal to the power supply temporarily right after the power supply is turned on.

4. The semiconductor device according to claim 1, wherein the switch control unit includes a differential amplifier.

5. The semiconductor device according to claim 1, wherein the switch control unit includes an inverter circuit.

6. A semiconductor device comprising:
   a capacitor unit that includes a plurality of parallel-connected capacitors, wherein each capacitor includes a gate terminal, a ground terminal, and a gate insulating film between the gate terminal and the ground terminal;
   a switch unit that electrically connects or disconnects the gate terminals to a power supply;
   a switch control unit that switches on the switch unit when a voltage of the capacitor unit is higher than a predetermined voltage, and switches off the switch unit when the voltage of the capacitor unit is lower than the predetermined voltage; and
   a reset unit that switches on the switch unit right after the power supply is turned on.

7. A semiconductor device comprising:
   a capacitor that includes
      a gate terminal;
      a ground terminal; and
      a gate insulating film between the gate terminal and the ground terminal;
   a switch unit that electrically connects or disconnects the ground terminal to a ground;
   a switch control unit that switches on the switch unit when a voltage of the ground terminal is lower than a predetermined voltage, and switches off the switch unit when the voltage of the ground terminal is higher than the predetermined voltage; and
   a reset unit that switches on the switch unit right after the power supply is turned on.

8. The semiconductor device according to claim 7, wherein
   the switch unit includes a n channel metal oxide semiconductor field effect transistor.

9. The semiconductor device according to claim 7, further comprising:
   a reset unit that resets the voltage of the ground terminal to electrically connect the ground terminal to the ground temporarily right after a power supply is turned on.

10. The semiconductor device according to claim 7, wherein
    the switch control unit includes a differential amplifier.

11. The semiconductor device according to claim 7, wherein
    the switch control unit includes an inverter circuit.

12. A semiconductor device comprising:
    a capacitor unit that includes a plurality of parallel-connected capacitors, wherein each capacitor includes a gate terminal, a ground terminal, and a gate insulating film between the gate terminal and the ground terminal;
    a switch unit that electrically connects or disconnects the ground terminals to a ground;
    a switch control unit that switches on the switch unit when a voltage of the capacitor unit is lower than a predetermined voltage, and switches off the switch unit when the voltage of the capacitor unit is higher than the predetermined voltage, and
    a reset unit that switches on the switch unit right after the power supply is turned on.

* * * * *